(12) United States Patent
Kamada et al.

(10) Patent No.: US 6,252,154 B1
(45) Date of Patent: Jun. 26, 2001

(54) THERMOELECTRIC MODULE

(75) Inventors: Kazuo Kamada, Osaka; Shunichi Nakayama, Mie, both of (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 09/407,969

(22) Filed: Sep. 29, 1999

(30) Foreign Application Priority Data

Nov. 25, 1998 (JP) .................................................. 10-333898

(51) Int. Cl.[7] .................................................... H01L 35/34
(52) U.S. Cl. ............................ 136/201; 136/203; 136/205
(58) Field of Search ..................................... 136/201, 203, 136/205

(56) References Cited

FOREIGN PATENT DOCUMENTS 6-237019 * 8/1994 (JP) .
8-228027    9/1996 (JP) .
11-68174    3/1999 (JP) .

* cited by examiner

*Primary Examiner*—Kathryn Gorgos
*Assistant Examiner*—Thomas Parsons
(74) *Attorney, Agent, or Firm*—Sughrue, Mion, Zinn, Macpeak & Seas, PLLC

(57) ABSTRACT

A thermoelectric module 1 comprising p-type thermoelectric elements 3a and n-type thermoelectric elements 3b which are alternately arranged and electrically connected by electrodes 4 provided on the top side and the bottom side of each thermoelectric element 3 and a heat exchanger plate 5 which is fixed on the electrodes on each side, in which each thermoelectric element 3 has a coating film 2 of an insulating material on the sides thereof except the sides joined to the electrodes 4, and the thermoelectric elements 3 are spaced apart. The coating film 2 improves the strength and moisture resistance of the thermoelectric elements 3 to prevent thermoelectric elements from cracking or breaking even in cases where a load, a shock, or a thermal stress is imposed thereon and to protect the thermoelectric elements against corrosion in a high humidity atmosphere, providing a thermoelectric module 1 with improved operational reliability.

7 Claims, 6 Drawing Sheets

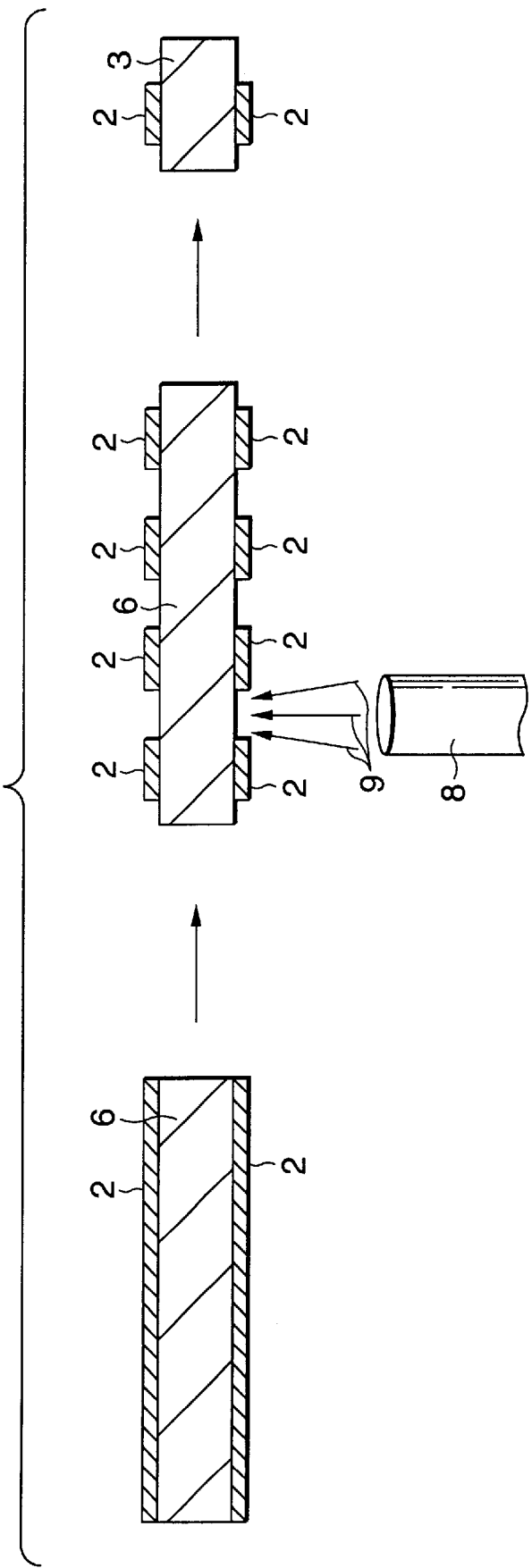

THERMOELECTRIC MODULE

BACKGROUND OF INVENTION

1. Field of the Invention

This invention relates to a thermoelectric module having a large number of thermoelectric elements arranged thereon.

2. Description of the Related Art

As shown in FIG. 7, a conventional thermoelectric module 1 has been produced by cutting out prism thermoelectric elements 3 from an ingot of a thermoelectric material prepared by melt growth such as zone melting, bonding the thermoelectric elements 3 to upper and lower electrodes 4 made of an electrically conductive material by soldering and the like to provide a predetermined conducting pattern, and fixing a heat exchanger plate 5 on each outer side of electrodes 4. When the thermoelectric element 3 and the electrode 4 are bonded with solder, there is formed a solder fillet 7 around the joint as shown in FIG. 8. The thermoelectric module 1 thus completed has a neat structure and enjoys the advantage that the thermoelectric elements 3 exhibit constant heat and constant heat conduction. Having a flat surface on each side, the thermoelectric module 1 is suited to production of a panel type apparatus having a thermoelectric element bonded to each side thereof.

However, because the thermoelectric elements 3 (i.e., p-type thermoelectric elements 3a and n-type thermoelectric elements 3b) are made of brittle materials, they tend to develop cracks or breaks in case a shock or a load is imposed to the thermoelectric module 1 or in case a thermal stress is applied to the thermoelectric element 3. In addition, because the thermoelectric elements 3 have poor moisture resistance, they tend to undergo corrosion in a high humidity atmosphere, resulting in deterioration of performance.

SUMMARY OF THE INVENTION

An object of the invention is to provide a thermoelectric module which has increased strength and improved moisture resistance and thereby exhibits improved operational reliability.

The invention provides a thermoelectric module which comprises p-type thermoelectric elements and n-type thermoelectric elements which are alternately arranged and electrically connected by electrodes provided on the top and the bottom sides of each thermoelectric element and a heat exchanger plate which is fixed on the electrodes on both sides of the thermoelectric elements, in which each thermoelectric element has a coating film of an insulating material on the sides thereof except the sides joined to the electrodes, and the thermoelectric elements are spaced apart.

In a preferred embodiment of the invention, the thermoelectric elements are elements cut out of a thermoelectric element blank and then coated with an insulating material.

In another preferred embodiment of the invention, the coating film is a polyimide film formed by chemical vapor deposition polymerization.

In still another preferred embodiment of the invention, the coating film is a poly(substituted or unsubstituted p-xylylene) film formed by chemical vapor deposition polymerization.

In yet another preferred embodiment of the invention, the parts in the vicinity of the upper and lower electrodes of the sides of each thermoelectric element other than the sides joined to the electrodes are not provided with the coating film of the insulating material.

BRIEF DESCRIPTION OF THE DRAWINGS

FIGS. 5A and 5B depict cross sections of another coated thermoelectric element, wherein FIG. 5B is an enlarged view of the circled part of FIG. 5A.

FIG. 6 illustrates another mode of preparation of thermoelectric elements using a bar blank.

DETAILED DESCRIPTION OF THE PREFERRED EMBODIMENTS

Figure 1:
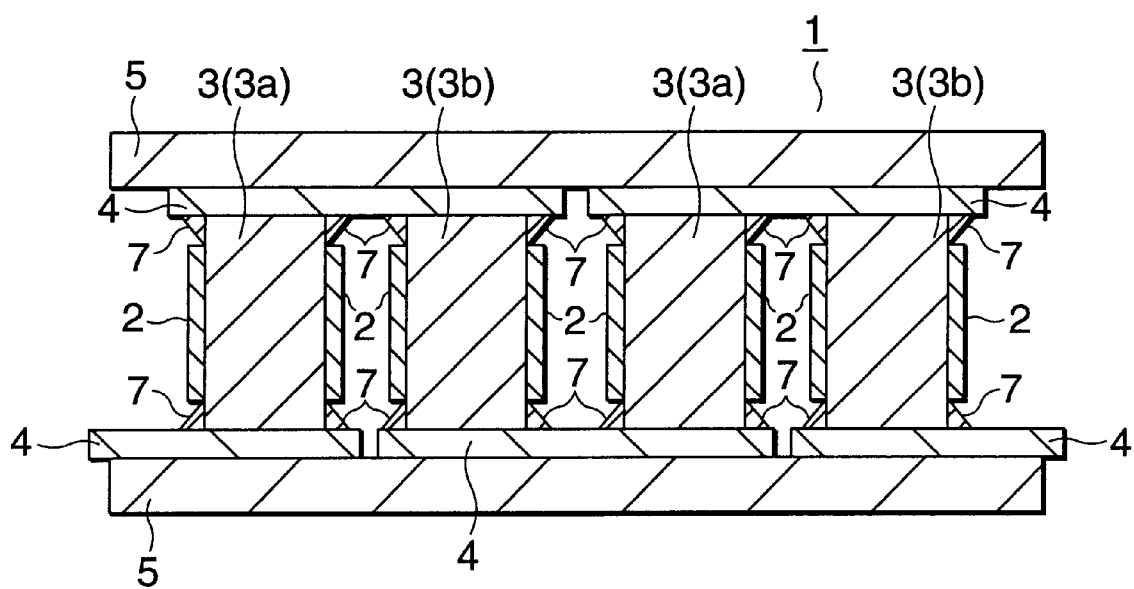
FIG. 1 is a cross section of an example of the thermoelectric module according to the invention.

The practice and preferred embodiments of the present invention will be described by referring to the accompanying drawings. In what follows, reference numeral 3 is used to indicate a thermoelectric element irrespective of whether it is of p-type or n-type, and reference numerals 3a and 3b are used to distinguish between the p-type and the n-type.

Figure 2A:
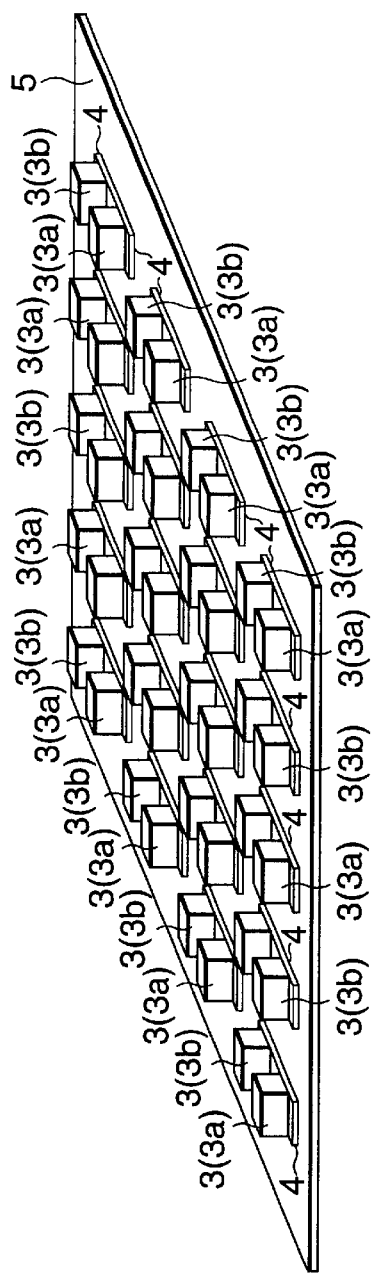
FIG. 2A is a perspective view of the thermoelectric module of FIG. 2B from which the upper heat exchanger plate is removed.
Figure 2B:
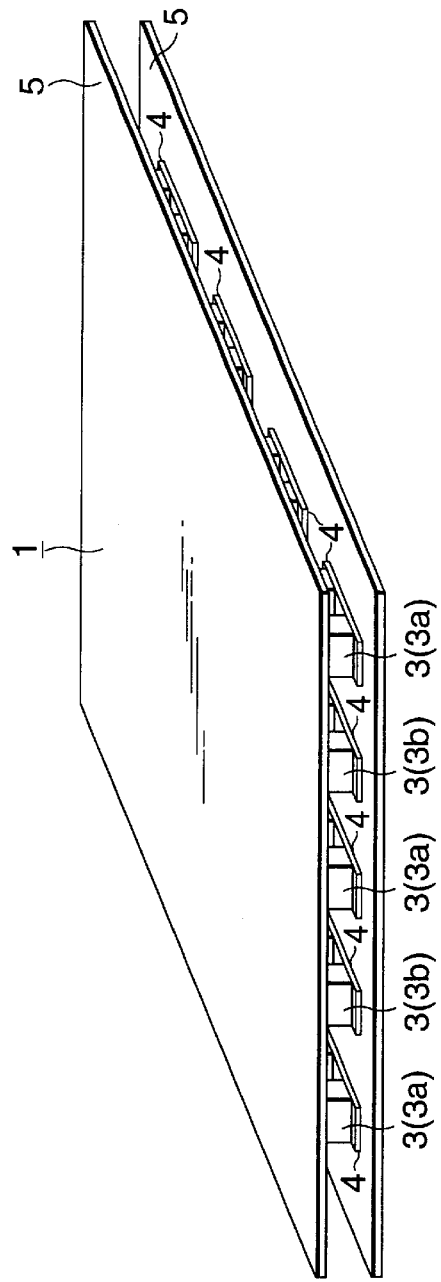
FIG. 2B shows a perspective view of an example of the thermoelectric module according to the invention.

FIGS. 1 and 2 depict an example of the thermoelectric module according to the invention. FIG. 1 is a cross sectional view of a thermoelectric module 1. FIG. 2A presents a perspective view of the thermoelectric module 1 without a heat exchanger plate 5 and electrodes 4 on its upper side, and FIG. 2B a perspective view with a heat exchanger plate 5 and electrodes 4 on the upper side. The thermoelectric module 1 comprises n-type thermoelectric elements 3b made of an n-type semiconductor and p-type thermoelectric elements 3a made of a p-type semiconductor, which alternate with spacing on the same plane. A large number of electrodes 4 are formed to cover the top and the bottom of every thermoelectric element 3 and also to bridge the top sides or the bottom sides of a p-type thermoelectric element 3a and an n-type thermoelectric element 3b, which are adjacent to each other, so that all the alternate thermoelectric elements 3a and 3b are electrically connected in series. A heat exchanger plate 5 made of an insulating material such as ceramics is attached onto the upper and the lower sides of the thermoelectric elements 3 via the electrodes 4. The thermoelectric elements 3 are arranged with spaces therebetween so that heat leakage among the thermoelectric elements 3 can be suppressed to improve heat exchange efficiency while the thermoelectric module 1 is in operation. It is preferred that the thermoelectric elements 3 be spaced 0.05 to 1.0 mm apart.

Figure 3A:
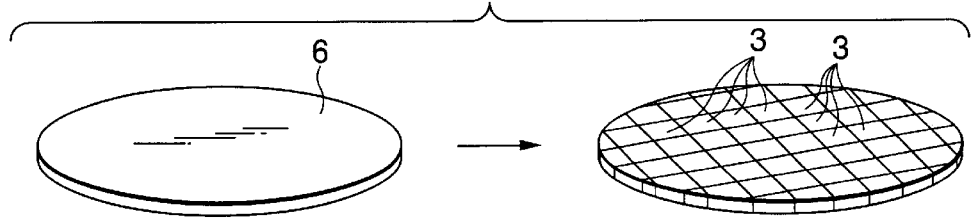
FIGS. 3A and 3B illustrate a mode of preparation of thermoelectric elements using a sheet blank and a bar blank, respectively.
Figure 3B:
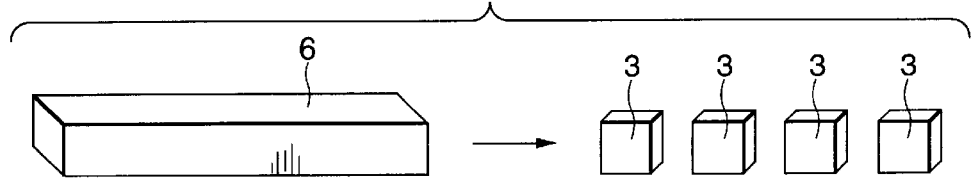

The thermoelectric element 3 used in the invention can be prepared as follows. First of all, a sheet blank 6 (FIG. 3A) or a bar blank 6 (FIG. 3B) of a thermoelectric material is prepared by slicing a thermoelectric material ingot or sintering or extrusion of a powdered thermoelectric material. Materials of p-type elements include $Sb_2Te_3$, and those of n-type include $Bi_2Te_3$. The sheet blank 6 or the bar blank 6 is diced to prepare thermoelectric prisms 3 as illustrated in FIG. 3. The top and the bottom of the prism are to be joined with the respective electrodes 4 and will hereinafter be sometimes referred to as a joint side(s) or surface(s).

Figure 4A:
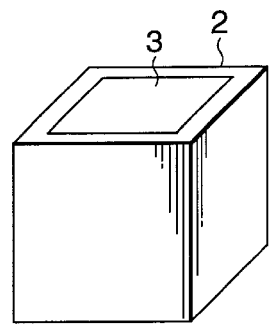
FIGS. 4A and 4B are a perspective view and a plane view, respectively, of a coated thermoelectric element.
Figure 4B:
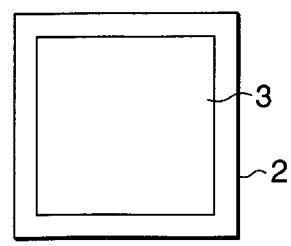

As shown in FIG. 4, a coating film 2 made of an insulting material is provided on every lateral face of the prism thermoelectric element 3, i.e., all the sides except the joint sides. To provide a coating film 2 around the thermoelectric element 3 is effective in enhancing the strength of the thermoelectric element 3 so that the element 3 can be prevented from cracking or breaking even in the case where a load, a shock, or a thermal stress is given thereto. The coating film 2 also brings about improved moisture resistance so that the element 3 can be protected against corrosion in a high humidity atmosphere, providing the thermoelectric module 1 with improved operational reliability.

The insulating material and the method of forming the coating film 2 are not particularly limited. In a highly preferred embodiment, the coating film is a film comprising a polyimide or poly(substituted or unsubstituted p-xylylene) formed by chemical vapor deposition polymerization (hereinafter referred to as CVD polymerization). Formation of the coating film 2 may be either preceded or followed by cutting a thermoelectric material blank 6 into thermoelectric elements 3.

Coating with a polyimide by CVD polymerization is carried out by introducing an acid anhydride and a diamine into a reaction vessel containing, as a substrate, a thermoelectric element 3 or a thermoelectric material blank 6 and kept at high temperature and under reduced pressure. In using, for example, pyromellitic dianhydride as an acid anhydride and 4,4'-diaminophenyl ether as a diamine, the reaction first gives a polyamic acid, a polyimide precursor, which undergoes dehydrating cyclization to produce a polyimide on the substrate as shown by the following reaction scheme:

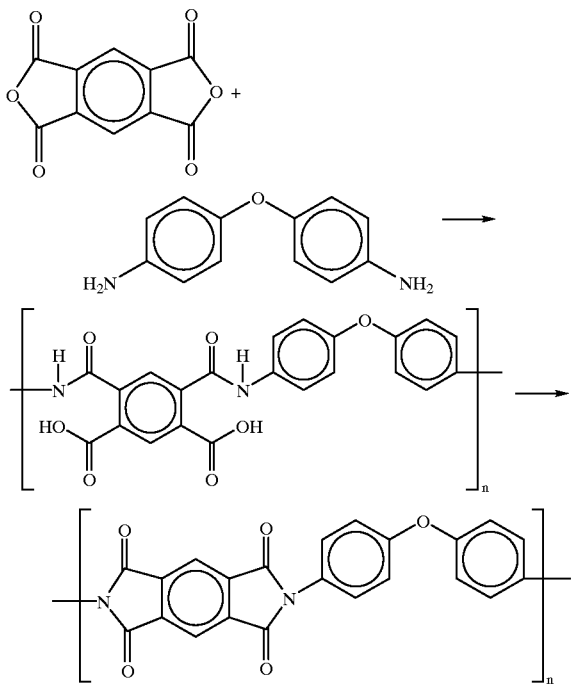

In more detail, pyromellitic dianhydride vaporized at 160 to 180° C. and 4,4'-diaminophenyl ether vaporized at 150 to 170° C. are introduced into a reaction vessel. The reaction system is maintained at 160 to 230° C. and $10^{-2}$ to $10^{-5}$ Torr for 30 to 120 minutes to form a polyamic acid. Then, the reaction system is maintained at 200 to 350° C. under atmospheric pressure for 1 to 5 hours to convert the polyamic acid to polyimide. The polyimide film thus formed preferably has a thickness of 1 to 10 μm.

The polyimide film by CVD polymerization is especially excellent in heat resistance so that it does not separate when a thermoelectric element 3 and an electrode 4 are joined by soldering. It is also excellent in chemical resistance, protecting the thermoelectric element 3 against deterioration even where the thermoelectric module 1 is used in an oxidative atmosphere or a corrosive atmosphere thereby improving operational reliability of the thermoelectric module 1.

Poly(substituted or unsubstituted p-xylylene), which is commercially available under a trade name PARYLENE, includes poly(p-xylylene) and a polymer of p-xylylene having an organic or inorganic substitutent, e.g., a halogen (e.g., chlorine) or a cyano group, usually on the benzene ring thereof. For example, poly(monochloro-p-xylylene) can be produced by CVD polymerization as shown by the following reaction scheme:

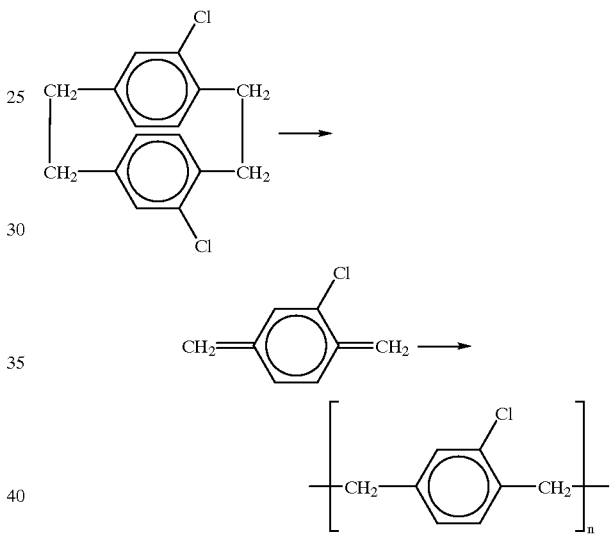

Di-p-xylylene, which is a cyclic dimer of monochloro-p-xylylene, is vaporized and then pyrolyzed to produce monochloro-p-xylene, a gaseous monomer. The monomer is led to a reaction vessel containing a thermoelectric element 3 or a thermoelectric material blank 6 as a substrate and allowed to polymerize on the substrate to form a poly(monochloro-p-xylylene) coating film. Preferred reaction conditions are 120 to 180° C. and 0.1 Torr or less for vaporization of di-p-xylylene; 650 to 730° C. and 0.1 Torr or less for pyrolysis of di-p-xylylene; and 40° C. or lower and 0.05 Torr or less for vapor phase polymerization of monochloro-p-xylene. The poly(substituted or unsubstituted p-xylylene) film thus produced preferably has a thickness of 1 to 10 μm.

Having little permeability to moisture, the poly(substituted or unsubstituted p-xylylene) film formed by CVD polymerization provides the thermoelectric element 3 with improved moisture resistance and is highly effective in protecting the thermoelectric element 3 against corrosion or deterioration of performance.

Figure 5A:
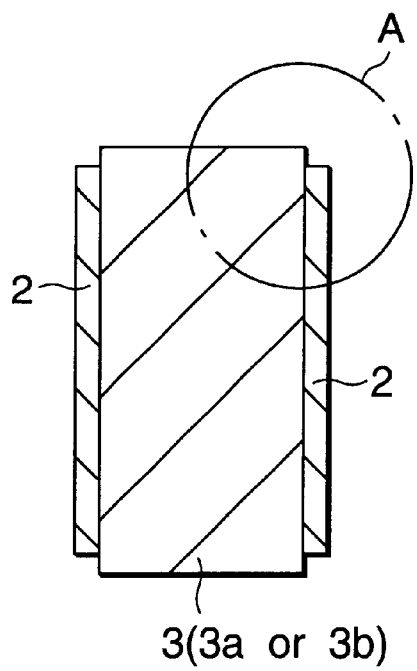
Figure 5B:
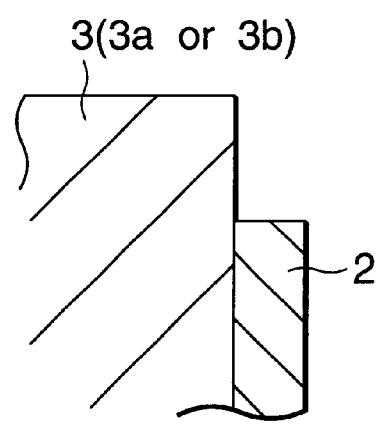
Figure 7:
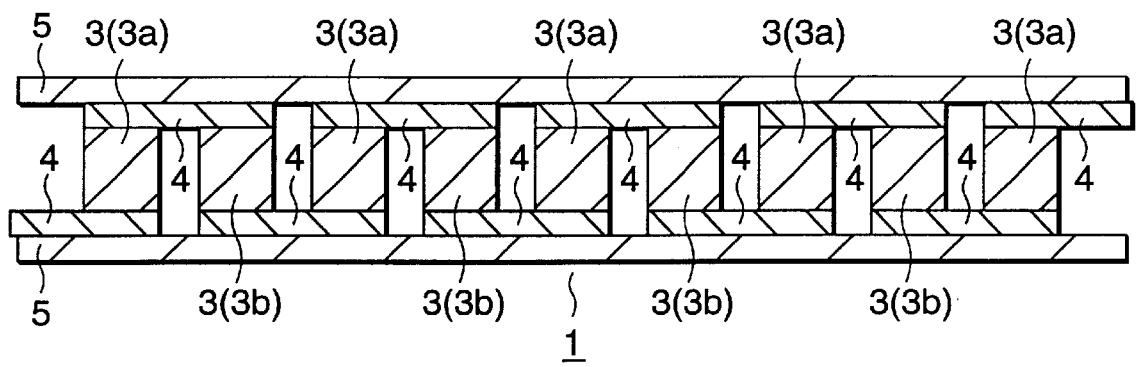
FIG. 7 shows a cross sectional view of a conventional thermoelectric module.
Figure 8:
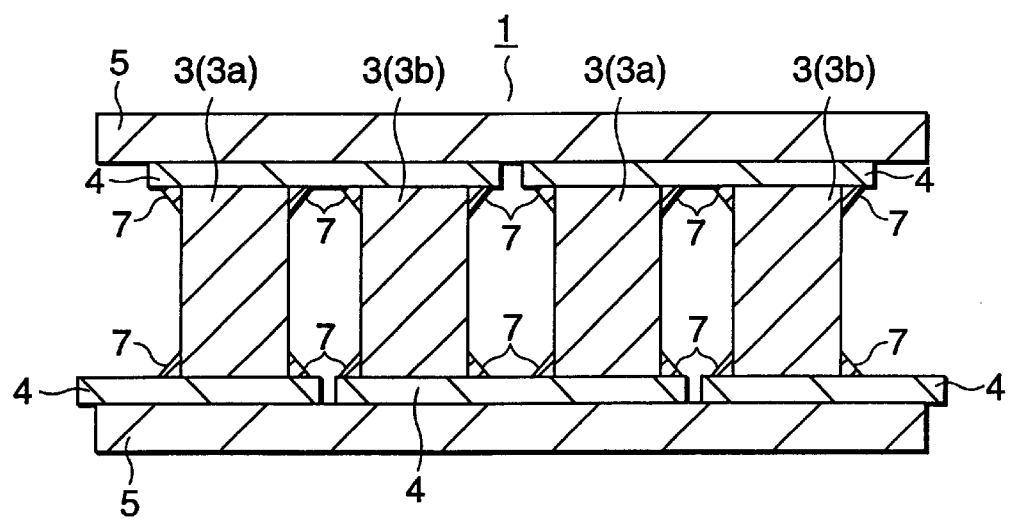
FIG. 8 is a cross sectional view of a conventional thermoelectric module, wherein solder fillets are shown.

As previously stated, the insulating coating film 2 is not formed on the joint sides of the thermoelectric element 3, i.e., the top and the bottom surfaces joined with the respective electrodes 4. In a highly preferred embodiment, of the sides except the joint sides, the parts in the vicinity of the joint sides are not provided with the coating film 2. That is, it is preferred that these parts remain uncoated, or after the insulating coating film 2 is once formed on the entire surfaces other than the joint sides, the coating film be removed from these parts. More specifically, as shown in FIGS. 5A and 5B, the part 0.01 to 0.5 mm from the upper end and the part 0.01 to 0.5 mm from the lower end of the thermoelectric element 3 preferably have no coating film 2. Such thermoelectric elements 3 with prescribed parts of their lateral faces having no coating film can be obtained, for example, as shown in FIG. 6, in which a coating film 2 of an insulating material is formed on all the surfaces of a thermoelectric material bar blank 6, and the coating film 2 on predetermined parts is removed by irradiation with a laser beam 9 from a laser oscillator 8, followed by cutting at the middle of the area where the coating film 2 has been removed. The laser beam machining can be replaced with machining with a lathe, etc. In this case, the cut surfaces serve as joint surfaces. Of the coating film formed on the sides other than the joint surfaces, the part in the vicinity of the joint surfaces has been removed by laser machining or machining.

When the thermoelectric element 3 and the electrode 4 are joined by soldering, a solder fillet 7 is formed around the joint seam. In case the part where the fillet 7 is to be formed has the coating film 2 (see FIG. 1), the wettability of the part with solder reduces, tending to lessen the joint strength between the thermoelectric element 3 and the electrode 4. Where, on the other hand, that part is not coated with the coating film 2 as in the above-described preferred embodiment, sufficient joint strength can be secured.

According to the invention, the coating film around the thermoelectric element gives the thermoelectric element increased strength and improved moisture resistance. As a result, the element is prevented from cracking or breaking even in the case where a load, a shock, or a thermal stress is imposed thereon and protected against corrosion in a high humidity atmosphere, providing a thermoelectric module with improved operational reliability. Further, the thermoelectric elements being spaced out, heat leakage among the elements is suppressed to improve heat exchange efficiency.

According to the first preferred embodiment in which the thermoelectric elements are elements cut out of a thermoelectric element blank and then coated with an insulating material, the coating film around the thermoelectric element not only enhances the strength of the thermoelectric element but brings about improved moisture resistance. As a result, the element is prevented from cracking or breaking even in the case where a load, a shock, or a thermal stress is imposed thereon and protected against corrosion in a high humidity atmosphere, providing a thermoelectric module with improved operational reliability.

According to the second preferred embodiment in which the coating film is a polyimide film formed by chemical vapor deposition polymerization, the coating film does not separate in soldering the thermoelectric elements and the electrodes. Excellent in chemical resistance, the coating film prevents performance deterioration of the thermoelectric elements even in an oxidative or corrosive atmosphere, providing a thermoelectric module with improved operational reliability.

According to the third preferred embodiment in which the coating film is a poly(substituted or unsubstituted p-xylylene) film formed by chemical vapor deposition polymerization, the thermoelectric elements have further improved moisture resistance, protected from corrosion or performance deterioration in a high humidity atmosphere.

According to the fourth preferred embodiment in which the parts in the vicinity of the electrodes of the sides of each thermoelectric element other than the sides joined to the electrodes have no coating with the insulating material, there is no coating film in the parts where solder fillets are formed, thereby ensuring the joint strength between the thermoelectric elements and the electrodes.

What is claimed is:

1. A thermoelectric module comprising:

p-type thermoelectric elements and n-type thermoelectric elements alternately arranged;

electrodes electrically connecting the top and the bottom sides of the thermoelectric elements, respectively;

a heat exchanger plate fixed on the electrodes on each side of electrodes, respectively;

a coating film of an insulating material on the surface of the thermoelectric element except an area where the thermoelectric element and the electrodes are joined; and a gap defined between the adjacent thermoelectric elements, wherein said coating film is a polyimide film formed by chemical vapor deposition polymerization.

2. A thermoelectric module comprising:

p-type thermoelectric elements and n-type thermoelectric elements alternately arranged;

electrodes electrically connecting the top and the bottom sides of the thermoelectric elements, respectively;

a heat exchanger plate fixed on the electrodes on each side of electrodes, respectively;

a coating film of an insulating material on the surface of the thermoelectric element except an area where the thermoelectric element and the electrodes are joined; and a gap defined between the adjacent thermoelectric elements, wherein said coating film is a poly(substituted or unsubstituted p-xylylene) film formed by chemical vapor deposition polymerization.

3. A thermoelectric module comprising:

p-type thermoelectric elements and n-type thermoelectric elements alternately arranged;

electrodes electrically connecting the top and the bottom sides of the thermoelectric elements, respectively;

a heat exchanger plate fixed on the electrodes on each side of electrodes, respectively;

a coating film of an insulating material on the surface of the thermoelectric element except an area where the thermoelectric element and the electrodes are joined; and a gap defined between the adjacent thermoelectric elements, wherein the area includes a portion defined in the vicinity of the area jointed portion.

4. A method for forming a coating film on a thermoelectric element comprising the steps of:

introducing an acid anhydride and a diamine into a reaction vessel to produce a polyamic acid on the thermoelectric element under the condition that the acid anhydride is vaporized at 160–180° C. and the diamine is vaporized at 150° C. to 170° C. and the reaction vessel is maintained at 160° C. to 230° C. and 10⁻² to 10⁻⁵ Torr; and subjecting dehydrating cyclization to produce a polyimide film on said thermoelectric element under the condition that the reaction vessel is maintained at 200° C. to 350° C.

5. A method for forming a coating film on a thermoelectric element as claimed in claim 4, wherein a thickness of polyimide is within 1–10 μm.

6. A method for forming a coating film on a thermoelectric element as claimed in claim 4, wherein a thickness of poly(substituted or unsubstituted p-xylyene) film is within 1–10 μm.

7. A method for forming a coating film on a thermoelectric element comprising the steps of:

vaporizing and pyrolyzing Di-p-xylylene under the condition that a temperature is within 120° C. to 180° C. and a pressure is 0.1 Torr or less;

pyrolyzing Di-p-xylylene to produce monochloro-p-xylene under the condition that a temperature is within 650° C. to 730° C. and a pressure is 0.1 Torr or less; and subjecting vapor phase polymerization of monochloro-p-xylene to produce the poly(substituted or unsubstituted p-xylyene) film on the a thermoelectric element under the condition that a temperature is 40° C. or lower and a pressure is 0.05 Torr.

\* \* \* \* \*